United States Patent
Chung et al.

(10) Patent No.: US 8,742,478 B2
(45) Date of Patent: Jun. 3, 2014

(54) GRAPHENE TRANSISTOR HAVING AIR GAP, HYBRID TRANSISTOR HAVING THE SAME, AND METHODS OF FABRICATING THE SAME

(71) Applicants: Hyun-jong Chung, Hwaseong-si (KR); U-in Chung, Seoul (KR); Ki-nam Kim, Seoul (KR)

(72) Inventors: Hyun-jong Chung, Hwaseong-si (KR); U-in Chung, Seoul (KR); Ki-nam Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/667,097

(22) Filed: Nov. 2, 2012

(65) Prior Publication Data

US 2013/0119349 A1  May 16, 2013

(30) Foreign Application Priority Data

Nov. 2, 2011 (KR) .................... 10-2011-0113585

(51) Int. Cl.
*H01L 29/76* (2006.01)

(52) U.S. Cl.
USPC ............ 257/288; 257/613; 438/275; 977/734

(58) Field of Classification Search
USPC ................ 257/288, 613; 438/275; 977/734
See application file for complete search history.

(56) References Cited

U.S. PATENT DOCUMENTS

| | | | |
|---|---|---|---|
| 7,781,061 B2 * | 8/2010 | Garcia et al. ................ | 428/402 |
| 7,927,978 B2 | 4/2011 | Pfeiffer | |
| 7,952,088 B2 | 5/2011 | Anderson et al. | |
| 2011/0156007 A1 | 6/2011 | Otsuji et al. | |
| 2011/0163298 A1 | 7/2011 | Sung | |
| 2011/0170330 A1 | 7/2011 | Oezyilmaz et al. | |
| 2011/0260136 A1 * | 10/2011 | Lee et al. ......................... | 257/9 |
| 2012/0181508 A1 * | 7/2012 | Chang et al. ................... | 257/29 |
| 2012/0181510 A1 * | 7/2012 | Avouris et al. ................. | 257/29 |
| 2013/0001518 A1 * | 1/2013 | Lin et al. ........................ | 257/29 |

OTHER PUBLICATIONS

H. Wang, et al. "BN/Graphene/BN Transistors for RF Applications," *IEEE Electron Device Letters*, 32(9), Sep. 2011.

* cited by examiner

*Primary Examiner* — Trung Q Dang
(74) *Attorney, Agent, or Firm* — Harness, Dickey & Pierce, P.L.C.

(57) ABSTRACT

A graphene transistor includes: a gate electrode on a substrate; a gate insulating layer on the gate electrode; a graphene channel on the gate insulating layer; a source electrode and a drain electrode on the graphene channel, the source and drain electrode being separate from each other; and a cover that covers upper surfaces of the source electrode and the drain electrode and forms an air gap above the graphene channel between the source electrode and the drain electrode.

24 Claims, 6 Drawing Sheets

GRAPHENE TRANSISTOR HAVING AIR GAP, HYBRID TRANSISTOR HAVING THE SAME, AND METHODS OF FABRICATING THE SAME

CROSS-REFERENCE TO RELATED APPLICATIONS

This application claims the benefit of Korean Patent Application No. 10-2011-0113585, filed on Nov. 2, 2011, in the Korean Intellectual Property Office, the disclosure of which is incorporated herein in its entirety by reference.

BACKGROUND

1. Field

One or more example embodiments relate to graphene transistors having an air gap over graphene, hybrid transistors including the graphene transistor and/or a metal-oxide-semiconductor (MOS) transistor, and/or methods of fabricating the hybrid transistors.

2. Description of the Related Art

Graphene, which has a 2-dimensional hexagonal carbon structure, is a new material that may replace semiconductors. Graphene is a zero gap semiconductor. Also, graphene has a carrier mobility of 100,000 $cm^2V^{-1}s^{-1}$ at room temperature, which is approximately 100 times higher than that of silicon. Thus, graphene may be applied to high-frequency devices, for example, radio frequency (RF) devices.

However, if graphene is formed to contact a substrate when a device is formed, the mobility of graphene is greatly reduced. That is, the mobility of graphene is high when the mobility is measured in a suspended state.

Graphene transistors using graphene having high mobility as a channel may be used as RF transistors that operate at a high speed.

SUMMARY

At least one example embodiment provides graphene transistors in which the mobility of a graphene channel is increased by forming an air gap over the graphene channel.

At least one example embodiment provides hybrid transistors that have a structure that includes a MOS transistor and a graphene transistor.

At least one example embodiment provides methods of fabricating the hybrid transistors.

Additional aspects will be set forth in part in the description which follows and, in part, will be apparent from the description, or may be learned by practice of example embodiments.

According to an example embodiment, there is provided a graphene transistor including: a gate electrode on a substrate; a gate insulating layer on the gate electrode; a graphene channel on the gate insulating layer; a source electrode and a drain electrode on the graphene channel, the source electrode and the drain electrode being separate from each other; and a cover that covers upper surfaces of the source electrode and the drain electrode and forms an air gap above the graphene channel between the source electrode and the drain electrode.

In at least one example embodiment, a length of the graphene channel between the source electrode and the drain electrode may be in a range of about 10 nm to about 100 nm.

The cover may be formed as a porous polymer or a porous insulating material.

In at least one example embodiment, the air gap may have a height in a range of about 20 nm to about 200 nm.

In at least one example embodiment, the gate insulating layer may be formed of hexagonal boron nitride.

In at least one example embodiment, the gate insulating layer may have a thickness in a range of about 0.5 nm to about 30 nm.

In at least one example embodiment, the graphene channel may be formed of one to five graphene layers.

In at least one example embodiment, the source electrode and the drain electrode may be on opposite sides of the graphene channel and include a plurality of interdigitated source and drain finger electrodes, and the gate electrode may include a plurality of gate finger electrodes disposed to cover a gap between two neighboring interdigitated source and drain finger electrodes.

According to an example embodiment, there is provided a hybrid transistor including: a metal-oxide-semiconductor (MOS) transistor formed on a substrate; and a graphene transistor disposed above the MOS transistor.

In at least one example embodiment The graphene transistor may include: a gate electrode on a first interlayer insulating layer, the first interlayer insulating layer covering the MOS transistor; a gate insulating layer on the gate electrode; a graphene channel on the gate insulating layer; a source electrode and a drain electrode on the graphene channel separate from each other; and a cover that covers upper surfaces of the source electrode and the drain electrode and forms an air gap above the graphene channel between the source electrode and the drain electrode.

According to an example embodiment, there is provided a method of fabricating a hybrid transistor, the method including: forming a metal-oxide-semiconductor (MOS) transistor on a substrate; forming a first interlayer insulating layer covering the MOS transistor on the substrate; forming first metals connected to a source electrode and a drain electrode of the MOS transistor and forming a gate electrode on the first interlayer insulating layer; sequentially forming a gate insulating layer and a graphene channel on the gate electrode; forming second metals connected to the first metals on the first interlayer insulating layer, and forming the source electrode and the drain electrode on the graphene channel, the source electrode and the drain electrode being separate from each other; filling a space between the source electrode and the drain electrode with a polymer; forming a cover that covers the polymer on the source electrode and the drain electrode; and forming an air gap between the graphene channel and the cover by removing the polymer.

In the graphene transistor according to an example embodiment, an air gap is formed above the graphene channel and, thus, the graphene transistor maintains high mobility characteristics. Therefore, the graphene transistor may be used as an RF transistor.

The hybrid transistor according to an example embodiment uses a graphene transistor where a high speed signal processing is needed, and a signal from the graphene transistor may be transferred to a MOS transistor. The MOS transistor may be used as an image display transistor of a display device.

According to an example embodiment, a transistor comprises: a graphene channel on a gate electrode of the transistor; source and drain electrodes on the graphene channel; and a cover on the source and drain electrodes such that the cover defines an air gap above the graphene channel.

According to an example embodiment, the source and the drain electrode are separated from each other by the graphene channel and include a plurality of interdigitated source and drain finger electrodes, and the gate electrode includes a plurality of gate finger gate electrodes disposed such that the gate finger electrodes cover a gap between two neighboring interdigitated source and drain finger electrodes.

According to an example embodiment, a hybrid transistor comprises: an MOS transistor on a substrate and in a first interlayer insulating layer of the substrate; and the transistor according to an example embodiment on the substrate and in a second interlayer insulating layer of the substrate, the second interlayer insulating layer being above the first interlayer insulating layer.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION OF EXAMPLE EMBODIMENTS

Figure 1:
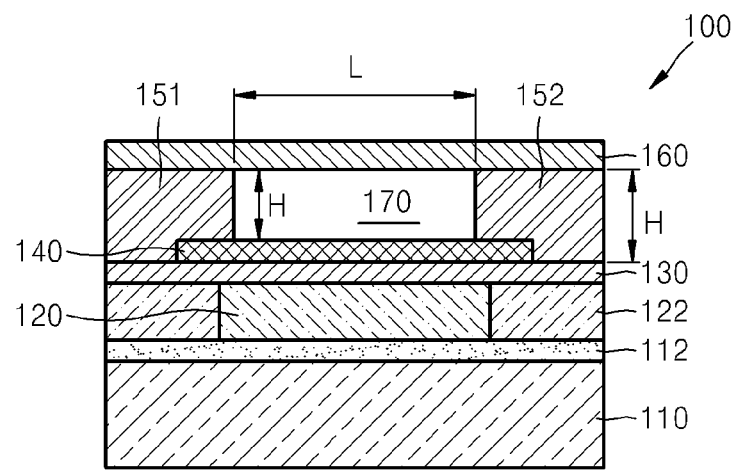
FIG. 1 is a schematic cross-sectional view of a graphene transistor according to an example embodiment.

Reference will now be made in detail to embodiments, examples of which are illustrated in the accompanying drawings. In the drawings, the thicknesses of layers and regions are exaggerated for clarity, and like reference numerals refer to like elements throughout and the descriptions thereof will not be repeated.

Spatially relative terms, such as "below", "beneath", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. As another example, it will be understood that when an element or layer is referred to as being "on," "above," "below," "beneath," "lower," "upper," etc., another element or layer, the element or layer may be directly on another element, may be above another element without directly contacting the element or layer, or may be intervening elements or layers there between.

It will be understood that when an element is referred to as being "connected to" or "coupled to" another element, it can be directly on, connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of example embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," and/or "including" when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
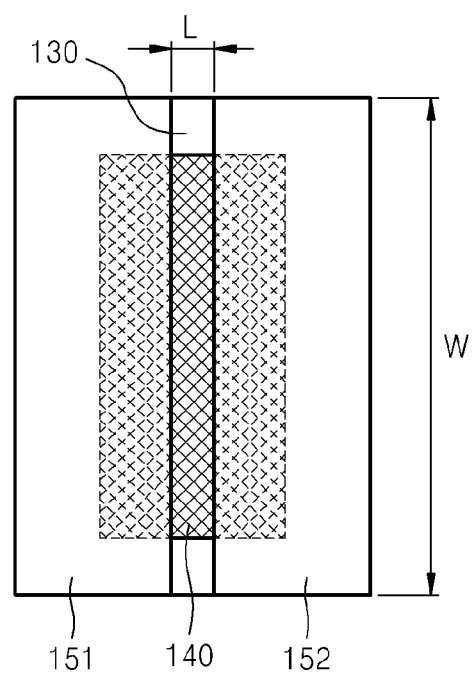
FIG. 2 is a plan view showing the disposition of electrodes of the graphene transistor of FIG. 1.

FIG. 1 is a schematic cross-sectional view of a graphene transistor 100 according to an example embodiment. FIG. 2 is a plan view of the graphene transistor 100 of FIG. 1 when a cover 160 is removed.

Referring to FIGS. 1 and 2, a first insulating layer 112 is formed on a substrate 110. The substrate 110 may be a silicon substrate. The first insulating layer 112 may be formed of silicon oxide or silicon nitride to a thickness in a range of about 100 nm to about 300 nm.

A gate electrode 120 is formed on the first insulating layer 112. The gate electrode 120 may be formed of a metal, such as aluminum.

A second insulating layer 122 may be formed around the gate electrode 120. The second insulating layer 122 may be formed of the same material used to form the first insulating layer 112.

A gate insulating layer 130 is formed on the gate electrode 120 and the second insulating layer 122. The gate insulating layer 130 may be formed of silicon oxide, aluminum oxide, silicon nitride, boron nitride, or hexagonal boron nitride, etc. The gate insulating layer 130 may be formed to a thickness of approximately less than 30 nm. If the thickness of the gate insulating layer 130 is greater than 30 nm, a driving voltage of the graphene transistor 100 may be increased.

A graphene channel 140 is formed on the gate insulating layer 130. The graphene channel 140 may be formed, for example, by transferring graphene formed by a chemical vapor deposition (CVD) method or by directly growing graphene. The graphene channel may be formed of one to five graphene layers.

The gate insulating layer 130 may be formed of hexagonal boron nitride. When the gate insulating layer 130 is formed of hexagonal boron nitride, the reduction in the mobility of the graphene channel 140 due to impurities on a surface of the gate insulating layer 130 may be reduced. When the gate insulating layer 130 is formed of hexagonal boron nitride, the gate insulating layer 130 may be formed to have a thickness of approximately 0.5 nm, which is a thickness of a single atom layer of the hexagonal boron nitride.

A source electrode 151 and a drain electrode 152 are formed on the graphene channel 140 separate from each other. The source electrode 151 and the drain electrode 152 may be formed on edges of the graphene channel 140. A cover 160 is formed on the source electrode 151 and the drain electrode 152. An air gap 170 is formed between the graphene channel 140, the source electrode 151, the drain electrode 152, and the cover 160.

A length L between the source electrode 151 and the drain electrode 152 may be in a range of about 10 nm to about 100 nm. It is difficult to pattern the length L less than 10 nm, and when the length L is greater than 100 nm, insulating materials may be too easily introduced between the source electrode 151 and the drain electrode 152 and cover the graphene channel 140. A width W of the source electrode 151 and the drain electrode 152 may be a few tens of μm. An aspect ratio of an area between the source electrode 151 and the drain electrode 152 is W/L, which may be in a range of about 50 to about 200.

A height H of the air gap 170 may be in a range of about 20 nm to about 200 nm. The height H of the air gap 170 may be within twice the length L between the source electrode 151 and the drain electrode 152.

The cover 160 may be formed as a porous polymer layer or a porous insulating layer. The porous polymer layer may be, for example, a porous silicon oxide layer. The cover 160 defines the air gap 170, and thus, when an insulating material is deposited on the graphene transistor 100 using a CVD method in a process of combining the graphene transistor 100 to another device, the air gap 170 may be filled with the insulating material if there is no cover 160. However, when the insulating material enters into the side opening (a front view in FIG. 1), the air gap 170 may be maintained because a side opening between the source electrode 151 and the drain electrode 152 is blocked due to the narrow length L between the source electrode 151 and the drain electrode 152. Accordingly, the reduction in the mobility of the graphene channel 140 may be reduced.

According to an example embodiment, the air gap 170 is formed over the graphene channel 140, thus, the reduction in the mobility of the graphene channel 140 may be reduced. Accordingly, the graphene transistor 100 may be used as an RF transistor having the high mobility of graphene.

Figure 3:
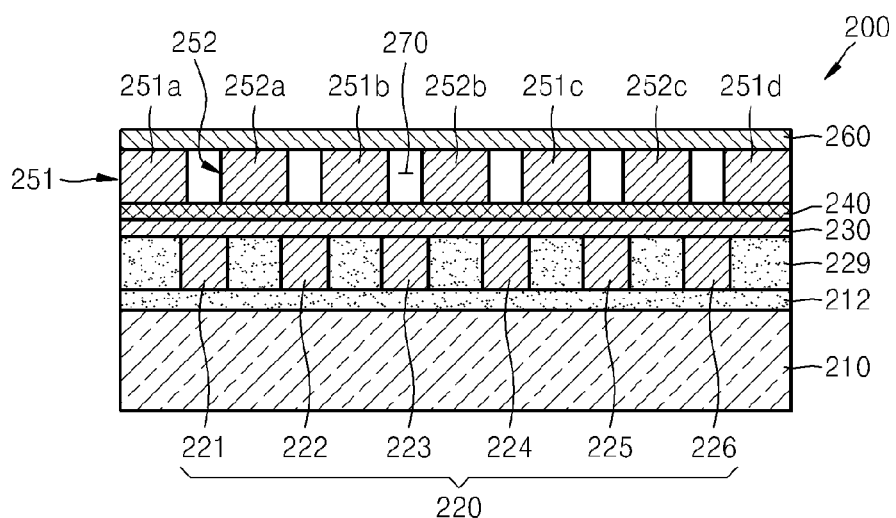
FIG. 3 is a schematic cross-sectional view of a graphene transistor according to another example embodiment.
Figure 4:
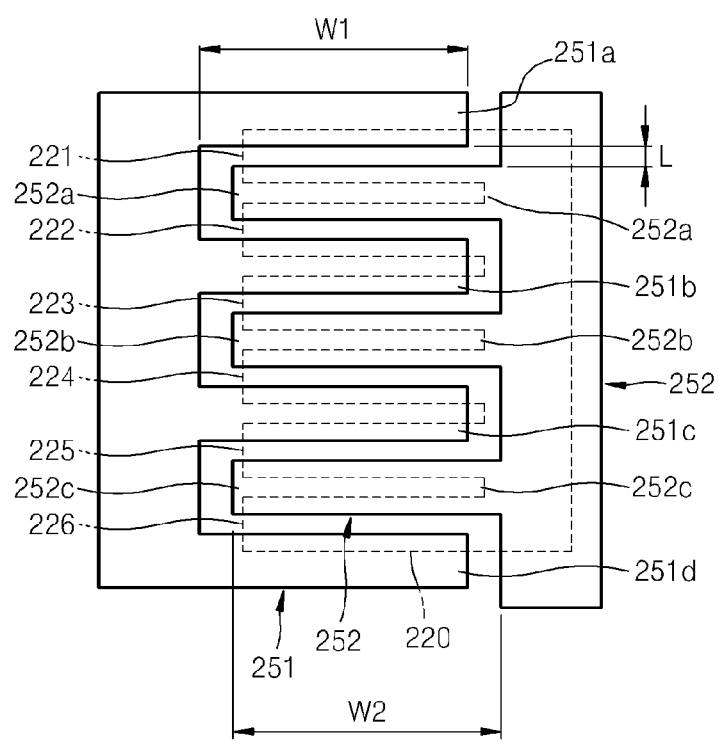
FIG. 4 is a plan view showing the arrangement of electrodes of the graphene transistor of FIG. 3.

FIG. 3 is a schematic cross-sectional view of a graphene transistor 200 according to another example embodiment. FIG. 4 is a plan view showing an arrangement of electrodes of the graphene transistor 200 of FIG. 3.

Referring to FIGS. 3 and 4, a first insulating layer 212 is formed on a substrate 210. The substrate 210 may be a silicon substrate. The first insulating layer 212 may be formed of silicon oxide or silicon nitride to a thickness in a range of about 100 nm to about 300 nm.

A gate electrode 220 is formed on the first insulating layer 212. The gate electrode 220 may be formed of a metal, such as aluminum. The gate electrode 220 may include a plurality of finger electrodes 221 through 226.

A second insulating layer 229 may be formed around the gate electrode 220. The second insulating layer 229 may be formed of the same material used to form the first insulating layer 212.

A gate insulating layer 230 is formed on the gate electrode 220 and the second insulating layer 229. The gate insulating layer 230 may be formed of silicon oxide, aluminum oxide, silicon nitride, boron nitride, or hexagonal boron nitride, etc. The gate insulating layer 230 may be formed to a thickness of approximately less than 30 nm. If the thickness of the gate insulating layer 230 is greater than 30 nm, a driving voltage of the graphene transistor 200 may be increased.

A graphene channel 240 is formed on the gate insulating layer 230. The graphene channel 240 may be formed, for example, by transferring graphene grown by a CVD method or by directly growing graphene on the gate insulating layer 230.

When the gate insulating layer 230 is formed of hexagonal boron nitride, the reduction in the mobility of the graphene channel 240 may be reduced. When the gate insulating layer 230 is formed of hexagonal boron nitride, the gate insulating layer 230 may be formed to have a thickness of approximately 0.5 nm, which is a thickness of a single atom layer of the hexagonal boron nitride.

A source electrode 251 and a drain electrode 252 are formed on the graphene channel 240 separate from each other. The source electrode 251 and the drain electrode 252 may include a plurality of finger electrodes 251a through 251d and a plurality of finger electrodes 252a through 252c, respectively. The finger electrodes 252a through 252c of the drain electrode 252 are alternately disposed between the finger electrodes 251a through 251d of the source electrode 251 (i.e., the finger source electrodes and finger drain electrodes are interdigitated). The finger electrodes 221 through 226 of the gate electrode 220 are disposed below the corresponding finger electrodes 251a through 251d of the source electrode 251 and the corresponding finger electrodes 252a through 252c of the drain electrode 252.

In FIGS. 3 and 4, four finger electrodes 251a through 251d of the source electrode 251 and three finger electrodes 252a through 252c of the drain electrode 252 are depicted. However, example embodiments are not limited thereto. For example, a plurality of finger electrodes of the source electrode 251 and a plurality of finger electrodes of the drain electrode 252 may be formed. Also, a plurality of finger electrodes of the gate electrode 220 are formed to correspond to the finger electrodes of the source electrode 251 and the finger electrodes of the drain electrode 252.

A cover 260 is formed on the source electrode 251 and the drain electrode 252. An air gap 270 is formed between the graphene channel 240, source electrode 251, the drain electrode 252, and the cover 260.

A length L between the finger electrodes 251a through 251d of the source electrode 251 and the finger electrodes 252a through 252c of the drain electrode 252 may be in a range of about 10 nm to about 100 nm. A width W1 of the finger electrodes 251a through 251d of the source electrode 251 and a width W2 of the finger electrodes 252a through 252c of the drain electrode 252 may be in a range of about a few μm to about a few tens of μm.

A height of the air gap 270 may be in a range of about 20 nm to about 200 nm. The height of the air gap 270 may be approximately within twice of the length L between the finger electrodes 251a through 251d of the source electrode 251 and the finger electrodes 252a through 252c of the drain electrode 252.

The cover 260 may be formed as a porous polymer layer or a porous insulating layer. The cover 260 defines the air gap 270, and thus, when an insulating material may be deposited on the graphene transistor 200 using a CVD method in a process of combining the graphene transistor 200 to another device, the air gap 270 may be filled with the insulating material if there is no cover 260. However, when the insulating material enters into side openings (a front view in FIG. 3), the air gap 270 may be maintained because the side openings between the finger electrodes 251a through 251d of the source electrode 251 and the finger electrodes 252a through 252c of the drain electrode 252 are blocked due to the narrow length L between the finger electrodes 251a through 251d of the source electrode 251 and the finger electrodes 252a through 252c of the drain electrode 252. Accordingly, the reduction in the mobility of the graphene channel 240 may be reduced.

According to an example embodiment, the air gap 270 is formed over the graphene channel 240, thus, the reduction in the mobility of the graphene channel 240 may be reduced. Accordingly, the graphene transistor 200 may be used as an RF transistor having the high mobility of graphene.

Figure 5:
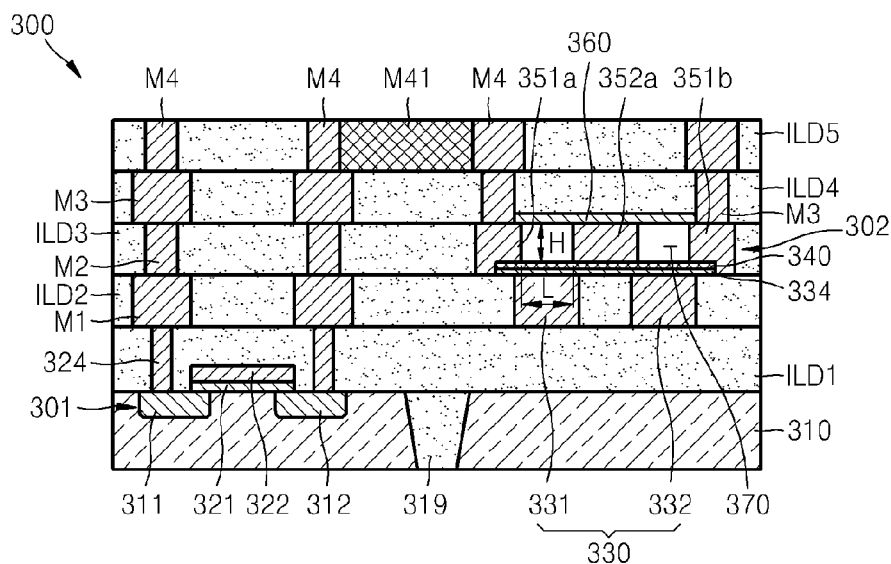
FIG. 5 is a schematic cross-sectional view of a hybrid transistor including a graphene transistor, according to an example embodiment.
Figure 6:
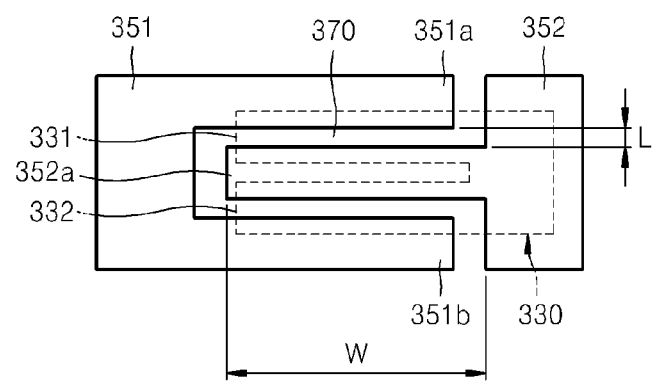
FIG. 6 is a plan view showing the arrangement of electrodes of the graphene transistor of FIG. 5.

FIG. 5 is a schematic cross-sectional view of a hybrid transistor 300 including a graphene transistor, according to an example embodiment. FIG. 6 is a plan view showing an arrangement of electrodes of the graphene transistor of FIG. 5.

Referring to FIG. 5, a metal-oxide-semiconductor (MOS) transistor 301 and a graphene transistor 302 are disposed on a substrate 310. The MOS transistor 301 may be an n-type MOS transistor or a p-type MOS transistor. In FIG. 5, an n-type MOS transistor is depicted. In FIG. 5, one MOS transistor 301 and one graphene transistor 302 are disposed on the substrate 310 as an example. However, a plurality of MOS transistors 301 and a plurality of graphene transistors 302 may be disposed on the substrate 310.

The substrate 310 may be a semiconductor substrate, for example, a silicon substrate. A device separation region 319 that defines an active region may be formed in the substrate 310. The device separation region 319 may be a shallow trench insulation (STI) region.

The MOS transistor 301 is a typical MOS transistor. A first dopant region 311 and a second dopant region 312 are formed in a surface of the substrate 310 separate from each other. One of the first dopant region 311 and the second dopant region 312 is a source region and the other is a drain region.

A gate insulating layer 321 is formed on the substrate 310 between the first dopant region 311 and the second dopant region 312. A gate electrode 322 is formed on the gate insulating layer 321. The gate electrode 322 may be formed of polysilicon or a metal.

A first interlayer insulating layer ILD1 is formed on the substrate 310 to cover the gate electrode 322. First vias 324 that are connected to the first dopant region 311 and the second dopant region 312, respectively, are formed in the first interlayer insulating layer ILD1.

A second interlayer insulating layer ILD2 is formed on the first interlayer insulating layer ILD1. First metals M1, which are connected to the first vias 324, and a gate electrode 330 are formed in the second interlayer insulating layer ILD2. As shown in FIG. 5, for convenience of explanation, it is depicted that the gate electrode 330 includes two finger electrodes 331 and 332.

A gate insulating layer 334 is formed on the second interlayer insulating layer ILD2 to cover the gate electrode 330. The gate insulating layer 334 may be formed of silicon oxide, aluminum oxide, silicon nitride, boron nitride, or hexagonal boron nitride, etc. to a thickness of approximately less than 30 nm. If the thickness of the gate insulating layer 334 is greater than 30 nm, the driving voltage of the hybrid transistor 300 may be increased.

When the gate insulating layer 334 is formed of hexagonal boron nitride, the reduction in the mobility of a graphene channel 340 may be reduced. When the gate insulating layer 334 is formed of hexagonal boron nitride, the gate insulating layer 334 may be formed to have a thickness of approximately 0.5 nm, which is a thickness of a single atom layer of the hexagonal boron nitride.

The graphene channel 340 is formed on the gate insulating layer 334. The graphene channel 340 may be formed, for example, by transferring graphene grown by a CVD method or by directly growing graphene on the gate insulating layer 334.

A source electrode 351 and a drain electrode 352 separated from each other are formed on the graphene channel 340. In FIGS. 5 and 6, for convenience of explanation, the source electrode 351 includes two finger electrodes 351a and 351b and the drain electrode 352 includes one finger electrode 352a. A length L between the finger electrodes 351a and 351b of the source electrode 351 and the finger electrode 352a of the drain electrode 352 may be in a range of about 10 nm to about 100 nm. A width W between the finger electrodes 352a and 351b and the finger electrode 352a of the drain electrode 252 may be in a range of about a few μm to about a few tens of μm. As shown in FIG. 2, the source electrode 351 and the drain electrode 352 may be a pair of electrodes that are opposite each other (e.g., the source electrode and the drain electrode are separated from each other by the gate insulating layer 130 and/or graphene channel 140). Also, as shown in FIG. 4, the source electrode 351 and the drain electrode 352 may include a plurality of finger electrodes, and the finger electrodes of the source electrode 351 and the finger electrodes of the drain electrode 352 may be alternately disposed (i.e., interdigitated).

A third interlayer insulating layer ILD3 that covers side surfaces of the source electrode 351 and the drain electrode 352 may be formed on the second interlayer insulating layer ILD2. Second metals M2 that are connected to the first metals M1 are formed in the third interlayer insulating layer ILD3.

The graphene transistor 302 includes a cover 360 that covers an upper side of a space between the source electrode 351 and the drain electrode 352. The cover 360 blocks a region between the source electrode 351 and the drain electrode 352 to reduce (or alternatively, prevent) vapor materials from entering into the region between the source electrode 351 and the drain electrode 352 in a subsequent CVD process. Although the vapor material may try to enter through a side between the source electrode 351 and the drain electrode 352, the vapor material deposited at the entrance is blocked because the length L between the finger electrodes 351a and 351b of the source electrode 351 and the finger electrode 352a of the drain electrode 352 is narrow. Accordingly, an air gap 370 is formed above the graphene channel 340.

The air gap 370 partially exposes the graphene channel 340. The height H of the air gap 370 may be in a range of about 20 nm to about 200 nm. The height H of the air gap 370 may be within twice the length L between the source electrode 351 and the drain electrode 352.

A fourth interlayer insulating layer ILD4 is formed on the third interlayer insulating layer ILD3 to cover the cover 360. Third metals M3 that are connected to the second metals M2, the source electrode 351, and the drain electrode 352 are formed in the fourth interlayer insulating layer ILD4.

A fifth interlayer insulating layer ILD5 may be formed on the fourth interlayer insulating layer ILD4. Fourth metals M4 that are connected to the third metals M3, may be formed in the fifth interlayer insulating layer ILD5. The fourth metals M4 may be electrode pads for applying an external voltage to the transistors 301 and 302. An electrode of the graphene transistor 302, for example, the source electrode 351, may be electrically connected to the second region 312 of the MOS transistor 301 through a connection wire M41.

The graphene transistor 302 includes the graphene channel 340 that has a high mobility due to the formation of the air gap 370 and may be an RF transistor.

In the hybrid transistor 300 described above, the graphene transistor 302 may be used where a high speed signal processing is needed, and a signal from the graphene transistor 302 may be transferred to the MOS transistor 301. The MOS transistor 301 may be used as an image display transistor of a display device.

FIGS. 7A through 7F are cross-sectional views sequentially showing a method of fabricating a hybrid transistor 400, according to an example embodiment.

Figure 7A:
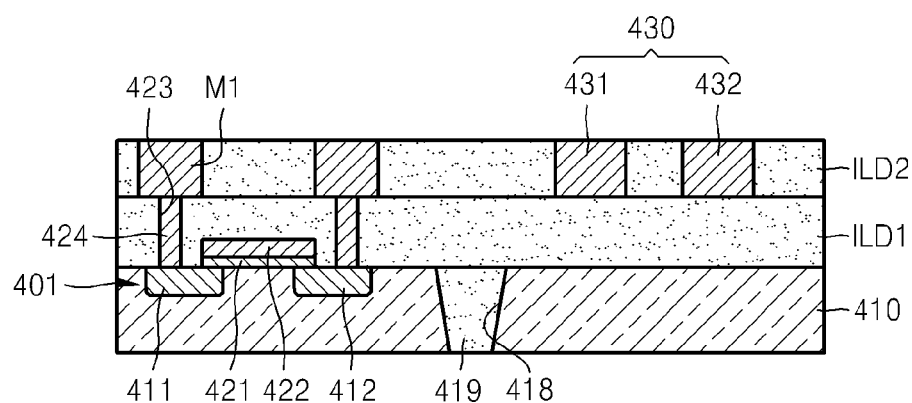
FIGS. 7A through 7F are cross-sectional views sequentially showing a method of fabricating a hybrid transistor, according to an example embodiment.

Referring to FIG. 7A, a MOS transistor 401 is formed on a substrate 410. The MOS transistor 401 may be an n-MOS type transistor or a p-MOS type transistor, and in the current embodiment, is an n-MOS type transistor. In FIG. 7A, one MOS transistor 401 and one graphene transistor 402 are formed on the substrate 410 as an example. However, example embodiments are not limited thereto, and a plurality of MOS transistors and a plurality of graphene transistors may be disposed on the substrate 410.

The substrate 410 may be a semiconductor substrate, for example, a silicon substrate 410. A device separation region 419 that defines an active region is formed in the substrate 410. The device separation region 419 may be formed by filling an insulating material in a trench 418 formed in the substrate 410. The device separation region 419 may be an STI region.

A first dopant region 411 and the second dopant region 412 are formed in a surface of the substrate 410 separate from each other. The substrate 410 may be a p-type silicon substrate, and the first dopant region 411 and the second dopant region 412 may be n-type regions.

A gate insulating layer 421 is formed on the substrate 410 between the first dopant region 411 and the second dopant region 412. A gate electrode 422 is formed on the gate insulating layer 421. The gate electrode 422 may be formed of polysilicon or a metal.

Next, a first interlayer insulating layer ILD1 is formed on the substrate 410 to cover the gate electrode 422. After forming first via holes 423 in the first interlayer insulating layer ILD1 to correspond the first and second dopant regions 411 and 412, respectively, first vias 424 are formed by filling the first via holes 423 with a metal, respectively.

Next, after forming a metal layer (not shown) on the first interlayer insulating layer ILD1, first metals M1 that are connected to the first vias 424 and a gate electrode 430 are formed by patterning the metal layer through a well-known patterning process. For convenience of explanation, in FIG. 7A, two finger electrodes 431 and 432 of the gate electrode 430 are depicted.

Next, an insulating layer (not shown) is formed on the first interlayer insulating layer ILD1 to cover the first metals M1 and the gate electrode 430. The insulating layer is planarized using, for example, a CMP method to form a second interlayer insulating layer ILD2 and to expose first metals M1 and the gate electrode 430.

Figure 7B:
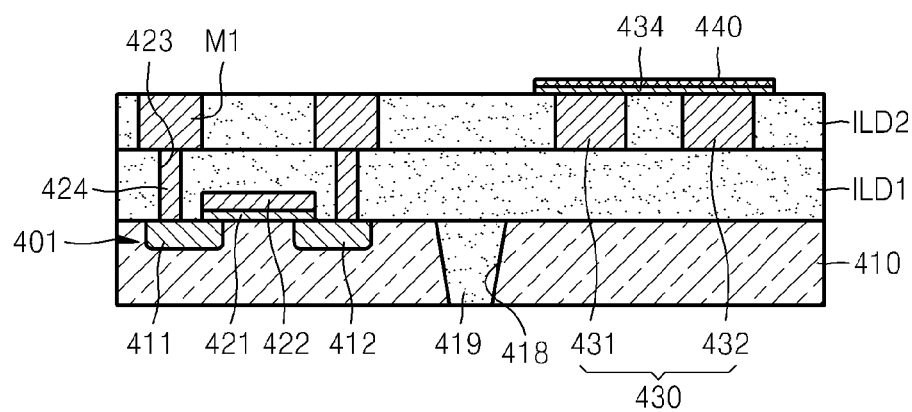

Referring to FIG. 7B, a gate insulating layer 434 is formed on the second interlayer insulating layer ILD2 to cover the gate electrode 430. The gate insulating layer 434 may be formed of silicon oxide, aluminum oxide, silicon nitride, boron nitride, or hexagonal boron nitride to a thickness of less than approximately 30 nm. If the thickness of the gate insulating layer 434 is greater than 30 nm, then the driving voltage of the hybrid transistor 400 may be increased.

The gate insulating layer 434 may be formed of hexagonal boron nitride. If the gate insulating layer 434 is formed of hexagonal boron nitride, then the reduction in the mobility of a graphene channel 440 may be reduced. If the gate insulating layer 434 is formed of hexagonal boron nitride, then the gate insulating layer 434 may be formed to have a thickness of approximately 0.5 nm, which is a thickness of a single atom layer of the hexagonal boron nitride.

The graphene channel 440 is formed on the gate insulating layer 434. The graphene channel 440 may be formed, for example, by transferring graphene grown by a CVD method. Also, the graphene channel 440 may be formed by directly growing the graphene on the gate insulating layer 434.

Figure 7C:
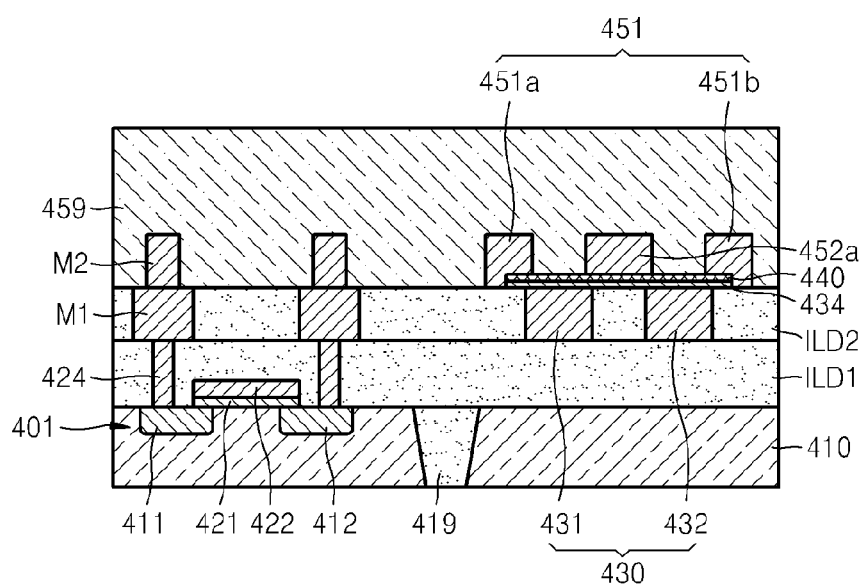

Referring to FIG. 7c, after forming a metal layer (not shown) on the second interlayer insulating layer ILD2, second metals M2 that are connected to the first metals M1 and a source electrode 451 and a drain electrode 452 on the graphene channel 440 are formed by patterning the metal layer. In FIG. 7C, for convenience of explanation, the source electrode 451 includes two finger electrodes 451a and 451b. Also, the drain electrode 452 includes one finger electrode 452a disposed between the finger electrodes 451a and 451b of the source electrode 451. The arrangement of the finger electrodes 451a and 451b of the source electrode 451 and the finger electrode 452a of the drain electrode 452 may be substantially the same as the arrangement of electrodes of FIG. 6, and thus, a detailed description thereof is omitted. The source electrode 451 may include a plurality of source finger electrodes, and the drain electrode 452 may also include a plurality of drain finger electrodes alternately disposed (i.e., interdigitated) between the finger electrodes of the source electrode 451.

A length L (refer to FIG. 6) between the source electrode 451 and the drain electrode 452 may be in a range of about 10 nm to about 100 nm. The width W (refer to FIG. 6) of the source electrode 451 and the drain electrode 452 may be in a range of about a few μm to about 100 nm a few tens of μm.

A polymer layer 459 is formed on the second interlayer insulating layer ILD2 by coating a polymer to cover the second metals M2, the source electrode 451, and the drain electrode 452a. The polymer 459 may be, for example, polydimethylsiloxane (PDMS). The polymer layer 459 fills spaces between the source electrode 451 and the drain electrode 452.

Figure 7D:
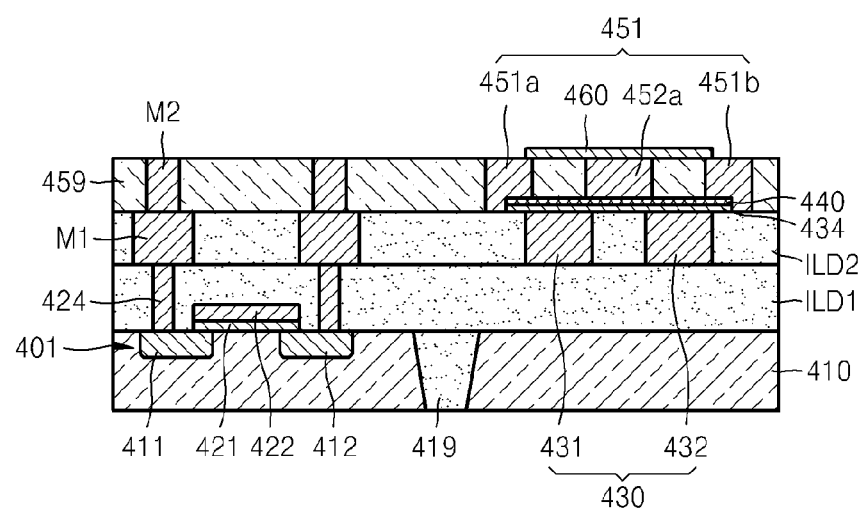

Referring to FIG. 7D, the second metals M2, the source electrode 451, and the drain electrode 452a are exposed by planarizing the polymer layer 459.

Next, a cover 460 is formed on the polymer layer 459 to cover upper surfaces of the finger electrodes 451a and 451b of the source electrode 451 and the finger electrode 452a of the drain electrode 452. The cover 460 may be formed through a patterning process after forming a porous polymer layer or a porous insulating layer on the polymer layer 459. The porous insulating layer may be formed of porous silicon oxide.

Figure 7E:
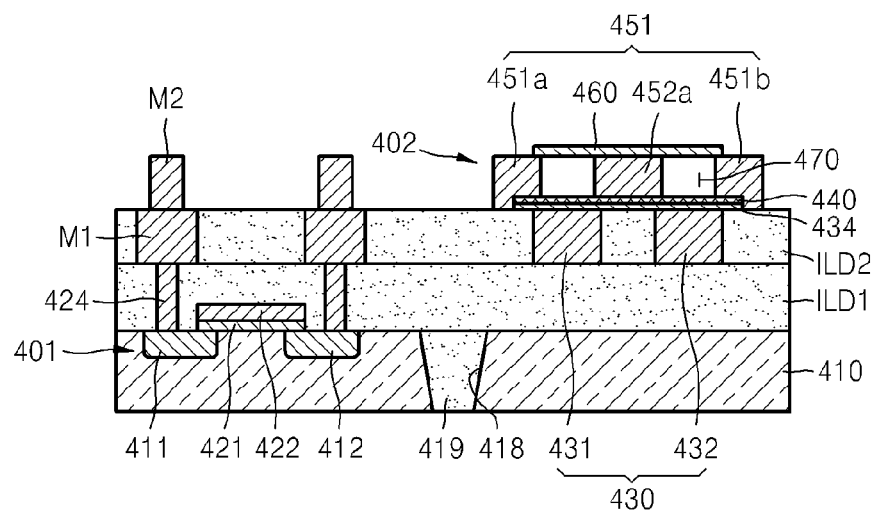

Referring to FIG. 7E, the polymer layer 459 is removed. The polymer layer 459 may be removed by using an oxide plasma process or a wet etching process. When the cover 460 is formed as a porous polymer layer or a porous insulating layer, a polymer of the polymer layer 459 between the graphene channel 440 and the cover 460 may be readily discharged to the outside through a hole formed in the cover 460. The polymer between the graphene channel 440 and the cover 460 may be a sacrifice layer. Portions from which the polymer between the graphene channel 440 and the cover 460 is removed may be air gaps 470. As a result, the manufacture of the graphene transistor 402 is complete.

Figure 7F:
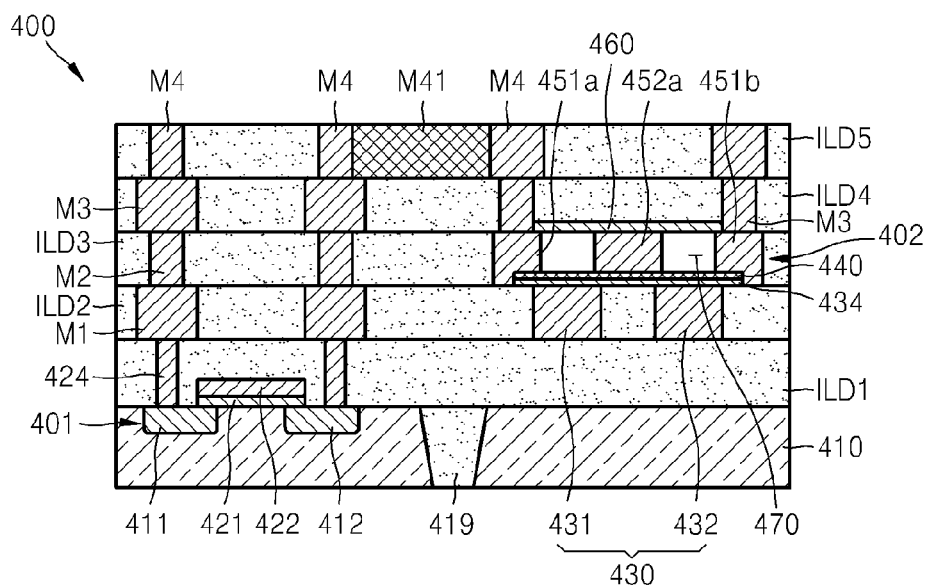

Referring to FIG. 7F, a third interlayer insulating layer ILD3 is formed on the second interlayer insulating layer ILD2 to cover the second metals M2 and the cover 460. At this point, a material used to form the third interlayer insulating layer ILD3 may not enter into the air gaps 470. For example, the material used to form the third interlayer insulating layer ILD3 accumulates at an entrance between the finger electrodes 451a and 451b of the source electrode 451 and the finger electrode 452a of the drain electrode 452 because the length L (refer to FIG. 6) is narrow, and thus, the air gaps 470 are maintained. Next, the second metals M2 and the cover 460 are exposed by planarizing the third interlayer insulating layer ILD3.

Next, after coating a metal layer (not shown) on the third interlayer insulating layer ILD3, third metals M3 that are connected to the second metals M2, the source electrode 451 and the drain electrode 452 are formed by patterning the metal layer. The third metals M3 that are connected to the source electrode 451 and the drain electrode 452, respectively, may be connected to the source electrode 451 and the drain electrode 452 in a region other than the region where the finger electrodes 451a, 451b, and 452a are formed.

A fifth interlayer insulating layer ILD5 may be formed on a fourth interlayer insulating layer ILD4. Fourth metals M4 that are connected to the third metals M3, respectively, may be formed in the fifth interlayer insulating layer ILD5. The fourth metals M4 may be electrode pads for applying an external voltage to the hybrid transistor 400. An electrode of the graphene transistor, for example, the source electrode 451, may be electrically connected to the second dopant region 412 of the MOS transistor 401 through a connection wire M41.

While some example embodiments have been particularly shown and described, it will be understood by one of ordinary skill in the art that variations in form and detail may be made therein without departing from the spirit and scope of the claims. Descriptions of features or aspects within each example embodiment should typically be considered as available for other similar features or aspects in other example embodiments.

What is claimed is:

1. A graphene transistor comprising:
   a gate electrode on a substrate;
   a gate insulating layer on the gate electrode, the gate insulating layer having a substantially flat shape;
   a graphene channel fixedly disposed on the gate insulating layer;
   a source electrode and a drain electrode on the graphene channel, the source electrode and drain electrode being separate from each other; and
   a cover that covers upper surfaces of the source electrode and the drain electrode and forms an air gap above the graphene channel between the source electrode and the drain electrode.

2. The graphene transistor of claim 1, wherein a length of the graphene channel between the source electrode and the drain electrode is in a range of about 10 nm to about 100 nm.

3. The graphene transistor of claim 1, wherein the cover is formed of a porous polymer or a porous insulating material.

4. The graphene transistor of claim 1, wherein the air gap has a height in a range of about 20 nm to about 200 nm.

5. The graphene transistor of claim 1, wherein the gate insulating layer is formed of hexagonal boron nitride.

6. The graphene transistor of claim 5, wherein the gate insulating layer has a thickness in a range of about 0.5 nm to about 30 nm.

7. The graphene transistor of claim 1, wherein the graphene channel is formed of one to five graphene layers.

8. A graphene transistor comprising:
   a gate electrode on a substrate;
   a gate insulating layer on the gate electrode;
   a graphene channel on the gate insulating layer;
   a source electrode and a drain electrode on the graphene channel, the source electrode and drain electrode being separate from each other; and
   a cover that covers upper surfaces of the source electrode and the drain electrode and forms an air gap above the graphene channel between the source electrode and the drain electrode, wherein the source electrode and the drain electrode are on opposite sides of the graphene channel and include a plurality of interdigitated source and drain finger electrodes, and the gate electrode includes a plurality of gate finger electrodes disposed to cover a gap between two neighboring interdigitated source and drain finger electrodes.

9. A hybrid transistor comprising:
   a metal-oxide-semiconductor (MOS) transistor on a substrate;
   a graphene transistor disposed above the MOS transistor, the graphene transistor including,
      a gate electrode on a first interlayer insulating layer, the first interlayer insulating layer covering the MOS transistor,
      a gate insulating layer on the gate electrode,
      a graphene channel on the gate insulating layer,
      a source electrode and a drain electrode on the graphene channel, the source electrode and the drain electrode being separate from each other, and
      a cover that covers upper surfaces of the source electrode and the drain electrode and forms an air gap on the graphene channel between the source electrode and the drain electrode.

10. The hybrid transistor of claim 9, wherein a length of the graphene channel between the source electrode and the drain electrode is in a range of about 10 nm to about 100 nm.

11. The hybrid transistor of claim 9, wherein the cover is formed of a porous polymer or a porous insulating material.

12. The hybrid transistor of claim 9, wherein the air gap has a height in a range of about 20 nm to about 200 nm.

13. The hybrid transistor of claim 9, wherein the gate insulating layer is formed of hexagonal boron nitride.

14. The hybrid transistor of claim 13, wherein the gate insulating layer has a thickness in a range of about 0.5 nm to about 30 nm.

15. The hybrid transistor of claim 9, wherein the graphene channel is formed of one to five graphene layers.

16. The hybrid transistor of claim 9, wherein the source electrode and the drain electrode are on opposite sides of the graphene channel and include a plurality of interdigitated source and drain finger electrodes, and the gate electrode includes a plurality of gate finger electrodes disposed to cover a gap between two neighboring interdigitated source and drain finger electrodes.

17. A method of fabricating a hybrid transistor, the method comprising:
   forming a metal-oxide-semiconductor (MOS) transistor on a substrate;
   forming a first interlayer insulating layer covering the MOS transistor on the substrate;

forming first metals connected to a source region and a drain region of the MOS transistor, and forming a gate electrode on the first interlayer insulating layer;

sequentially forming a gate insulating layer and a graphene channel on the gate electrode;

forming second metals connected to the first metals on the first interlayer insulating layer, and forming a source electrode and a drain electrode on the graphene channel, the source electrode and the drain electrode being separate from each other;

filling a space between the source electrode and the drain electrode with a polymer;

forming a cover that covers the polymer on the source electrode and the drain electrode; and forming an air gap between the graphene channel and the cover by removing the polymer.

18. The method of claim 17, wherein the length of the graphene channel between the source electrode and the drain electrode is in a range of about 10 nm to about 100 nm.

19. The method of claim 17, wherein the cover is formed of a porous polymer or a porous insulating material.

20. The method of claim 17, wherein the air gap has a height in a range of about 20 nm to about 200 nm.

21. The method of claim 17, wherein the gate insulating layer is formed of a hexagonal boron nitride.

22. The method of claim 21, wherein the gate insulating layer has a thickness in a range of about 0.5 nm to about 30 nm.

23. The method of claim 17, wherein the graphene channel is formed of one to five graphene layers.

24. The method of claim 17, wherein the forming of the source electrode and the drain electrode includes forming the source electrode and the drain electrode on opposite sides of the graphene channel and forming a plurality of interdigitated source and drain finger electrodes, and the forming of the gate electrode includes forming a plurality of gate finger electrodes disposed to cover a gap between two neighboring interdigitated source and drain finger electrodes.

* * * * *